United States Patent
Gluschenkov et al.

(10) Patent No.: US 6,797,582 B2
(45) Date of Patent: Sep. 28, 2004

(54) VERTICAL THERMAL NITRIDE MASK (ANTI-COLLAR) AND PROCESSING THEREOF

(75) Inventors: Oleg Gluschenkov, Wappingers Falls, NY (US); Michael P. Chudzik, Beacon, NY (US); Rajarao Jammy, Wappingers Falls, NY (US); Christopher C. Parks, Poughkeepsie, NY (US); Kenneth T. Settlemyer, Jr., Poughquag, NY (US); Radhika Srinivasan, Mahwah, NJ (US); Kathryn H. Varian, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/426,336

(22) Filed: Apr. 30, 2003

(65) Prior Publication Data

US 2003/0203587 A1 Oct. 30, 2003

Related U.S. Application Data

(62) Division of application No. 10/013,797, filed on Dec. 10, 2001.

(51) Int. Cl.[7] ............................................. H01L 21/20
(52) U.S. Cl. ...................... 438/392; 438/246; 438/248; 438/389; 438/391
(58) Field of Search ................................ 438/246, 248, 438/389, 391, 392

(56) References Cited

U.S. PATENT DOCUMENTS

| | | | |
|---|---|---|---|
| 4,789,560 A | * | 12/1988 | Yen ............................. 438/386 |
| 4,843,025 A | | 6/1989 | Morita |
| 5,112,771 A | | 5/1992 | Ishii et al. |
| 5,482,883 A | | 1/1996 | Rajeevakumar |
| 5,618,751 A | | 4/1997 | Golden et al. |
| 5,658,816 A | | 8/1997 | Rajeevakumar |
| 5,670,805 A | * | 9/1997 | Hammerl et al. ........... 257/301 |
| 5,869,858 A | * | 2/1999 | Ozawa et al. ............... 257/296 |
| 5,910,018 A | | 6/1999 | Jang |
| 5,930,107 A | | 7/1999 | Rajeevakumar |
| 6,008,104 A | | 12/1999 | Schrems |
| 6,018,174 A | | 1/2000 | Schrems et al. |
| 6,066,527 A | * | 5/2000 | Kudelka et al. ............ 438/243 |
| 6,146,938 A | | 11/2000 | Saida et al. |
| 6,150,257 A | | 11/2000 | Yin et al. |
| 6,313,033 B1 | | 11/2001 | Chiang et al. |
| 6,534,376 B2 | * | 3/2003 | Tews .......................... 438/386 |

OTHER PUBLICATIONS

R.L. Kleinhenz, et al., "Trench Capacitor and Dry Etching Technique of Forming Same with Increased Capacitance Density Relative to Conventional Trench Capacitor", IBM Technical Disclosure Bulletin, vol. 34, No. 5 (Oct. 1991).

* cited by examiner

*Primary Examiner*—Amir Zarabian
*Assistant Examiner*—Jeff Vockrodt
(74) *Attorney, Agent, or Firm*—Scully, Scott, Murphy & Presser; Joseph P. Abate

(57) ABSTRACT

A 3D microelectronic structure is provided which includes a substrate having at least one opening present therein, the at least one opening having sidewalls which extend to a common bottom wall; and a thermal nitride layer present on at least an upper portion of each sidewall of openings. A method for fabricating the above-mentioned 3D microelectronic structure is also provided. Specifically, the method includes a step of selectively forming a thermal nitride layer on at least an upper portion of each sidewall of an opening formed in a substrate.

10 Claims, 6 Drawing Sheets

VERTICAL THERMAL NITRIDE MASK (ANTI-COLLAR) AND PROCESSING THEREOF

RELATED APPLICATION

This application is a divisional of U.S. application Ser. No. 10/013,797, filed Dec. 10, 2001.

FIELD OF THE INVENTION

The present invention relates to three-dimensional (3D) microelectronic device processing, and more particular to a method of fabricating at least one opening, e.g., trench or via, in a substrate wherein a thin, uniform thermal nitride vertical hard mask, which prohibits diffusion of dopants into the substrate, is formed on at least an upper portion of exposed sidewalls of the opening. The present invention is also directed to 3D microelectronic structures which include the above-mentioned thin, uniform thermal nitride mask on at least an upper portion of exposed sidewalls of an opening formed in a substrate.

BACKGROUND OF THE INVENTION

Trench or via processing for three-dimensional (3D) microelectronic fabrication, e.g., dynamic random access memory (DRAM) cells, includes making of a portion of a trench or via for p-n junction definition by diffusion; non-uniform (enhanced) doping of selected areas; and formation of electrical isolation regions in selected areas. Therefore, a masking method is needed to select portions of a trench or via for desired processing.

In general, masking processes require the use of a hard mask (planar or vertical) to protect selected portions of the substrate against doping, etching, oxidation, deposition, implantation, and other processing. Contrary to a photoresist (PR) and other polymer masks, hard masks are able to withstand high-temperature processing. In addition, hard masks may have a higher etch selectivity than that of a polymer mask.

The fabrication sequence for a planar hard mask is straightforward. First, a hard mask material is deposited over an entire surface of a substrate and thereafter a patterned PR mask is formed over the hard mask using conventional photolithographic methods. Next, the hard mask material is removed from selected areas utilizing a selective etching process. Consequently, the remaining planar hard mask material protects pre-selected areas of the substrate.

The fabrication sequence of a vertical hard mask, on the other hand, is complicated. Indeed, there are no known photolithography methods that would leave photoresist in the upper portion of a trench or via and remove resist from the bottom portion of the trench or via. The vertical hard masks are typically made utilizing the following five steps: (i) depositing a sacrificial material into an opening of a 3D microelectronic structure; (ii) planarizing the sacrificial material; (iii) recessing the sacrificial material to a predetermined depth; (iv) forming a hard mask on an upper portion of the opening; and (v) removing the sacrificial material from the opening.

There are several requirements for using vertical hard masks which include: (1) a vertical hard mask should be suitable for use with high-temperature (about 300°–100° C.) processing and the vertical hard mask should not loose its masking properties at the above-mentioned high-temperatures; (2) the vertical hard mask should be substantially thin (as compared to the mouth of the trench or via) so that the hard mask does not interfere with the deposition of various materials into the trench or via; and (3) the process sequence needed to create such a hard mask must be relatively simple.

One standard way of producing a vertical hard mask for lining at least a portion of a trench or via is to use a thin oxide grown on an exposed surface of a Si-containing substrate, while protecting selected areas with deposited silicon nitride. Because silicon nitride oxidizes very slowly one can grow a relatively thick layer of thermal oxide on the Si-containing substrate, while oxidizing only several atomic layers of silicon nitride. Subsequently, silicon nitride is stripped selectively to the thick oxide layer grown on the Si-containing substrate.

There are several problems with using such an approach. A vertical mask comprising a thermally grown oxide layer is not a good diffusion barrier; therefore, the thermal oxide mask has to be grown relatively thick in order to block dopant diffusion. For narrow openings, i.e., trenches or vias, the thickness of the oxide mask can be comparable to the dimensions of the opening preventing a good fill into the trench or via. In addition, thermally grown oxide masks are not typically uniform along the perimeter of the opening (the thermally grown oxide is usually thinner at the corners). Such non-uniformity is due to the different oxidation rate of different crystallographic planes of silicon and build-up of stress in the corners.

One known modification to the oxide mask process described above is directed towards thermal nitridation of the oxide mask. When nitrogen is introduced into a thermally grown oxide mask, the nitrogen reduces diffusion of dopants through the thermal oxide layer. Due to a high chemically stability of the thermally grown oxide layer only a small percentage (typically below 20 atomic percent) of nitrogen atoms is incorporated into the thermal oxide mask. Therefore, the oxynitride or nitrided oxide mask has to be relatively thick to block dopant diffusion at high temperatures.

In view of the above drawbacks with thermally grown oxide vertical masks, a new and improved method is required to form a thin, uniform vertical hard mask, which functions as a diffusion barrier so as to prevent unwanted diffusion of dopant into substrate during p-n junction definition.

SUMMARY OF THE INVENTION

One object of the present invention is to provide a method for fabricating 3D microelectronic structures which include at least one opening present in a substrate wherein a vertical hard mask which is resistant to high-temperature processing is employed.

Another object of the present invention is to provide a method for fabricating 3D microelectronic structures which include at least one opening present in a substrate wherein a substantially thin vertical hard mask is employed to protect selective portions of the opening.

A further object of the present invention is to provide a method of fabricating 3D microelectronic structures which include at least one opening present in a substrate wherein simple processing steps are employed to form a vertical hard mask on at least an upper portion of exposed sidewalls of the at least one opening.

A yet further object of the present invention is to provide a method of fabricating 3D microelectronic structures which include at least one opening present in a semiconductor substrate wherein a thin, uniform vertical hard mask is formed on an upper portion of exposed sidewalls of the at least one opening.

These and other objects and advantages are achieved in the present invention by forming a thermal nitride vertical hard mask on at least an upper portion of exposed interior sidewalls of an opening formed in a substrate (either semiconducting or insulating). The thermal nitride employed in the present invention is substantially thin, on the order of from about 10 to about 50 Å, and the thermal nitride is a very good dopant diffusion barrier material. The inventive method employed in forming the thermal nitride vertical hard mask is relatively simple and easy to implement with existing semiconductor device processing schemes.

In one aspect of the present invention, a 3D microelectronic structure containing a thin thermal nitride hard mask on selective portions of an opening formed in a substrate is provided. In broad terms, the 3D microelectronic structure of the present invention comprises:

a substrate having at least one opening present therein, said at least one opening having sidewalls which extend to a common bottom wall; and a thermal nitride layer present on at least an upper portion of each sidewall of said at least one opening.

Another aspect of the present invention comprises a method for fabricating the abovementioned 3D microelectronic structure. Specifically, the inventive method comprises the steps of:

(a) forming at least one opening in a surface of a substrate, said at least one opening having sidewalls which extend to a common bottom wall; and (b) forming a thermal nitride layer on at least an upper portion of each sidewall of said at least one opening.

DETAILED DESCRIPTION OF THE INVENTION

The present invention, which provides a method of forming a thermal nitride vertical hard mask on at least an upper portion of an opening formed in a substrate as well as the resultant 3D microelectronic structure formed by the aforementioned method, will now be described in greater detail by referring to drawings that accompany the present application.

It is noted that the attached drawings illustrate a preferred embodiment of the present invention wherein a thin, uniform nitride vertical hard mask is employed to protect an upper portion of an opening formed in a semiconductor substrate. Although illustration is given for this preferred embodiment, the inventive method works in other applications in which a vertical hard mask is required to be formed on at least an upper portion of an opening formed in a substrate. The term "substrate" is used herein to denote both semiconducting as well as insulating materials (including organic and inorganic insulators), with semiconducting materials being exemplified in the accompanying drawings.

Figure 1:
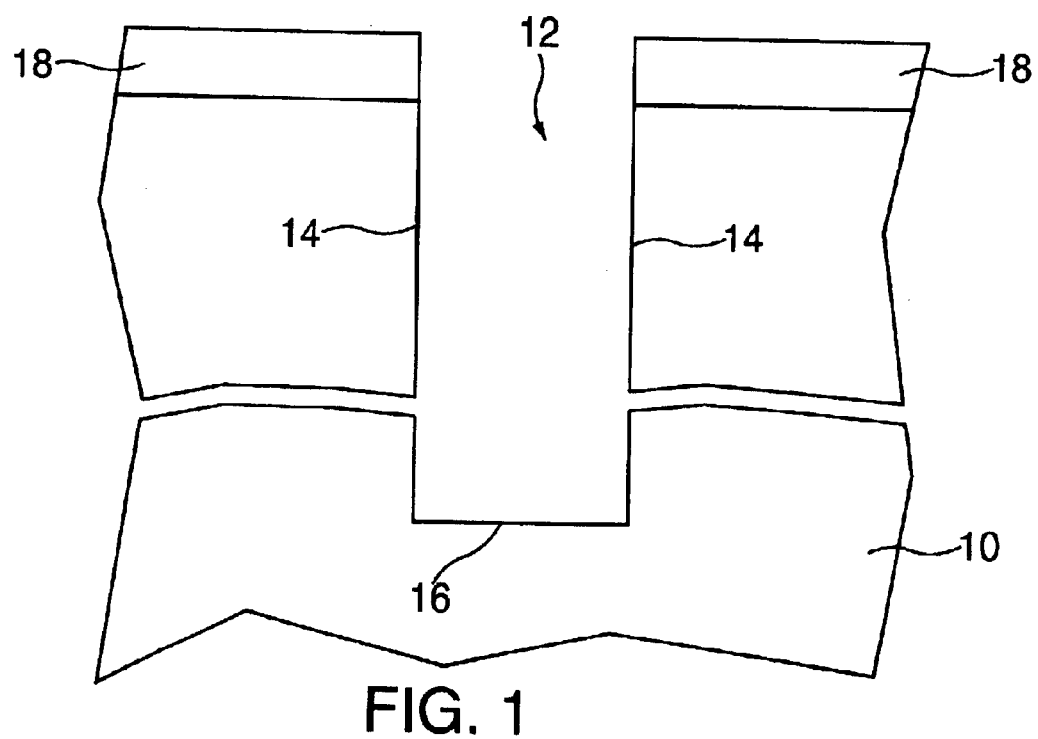
FIGS. 1–11 are pictorial representations (through cross-sectional views) illustrating the various processing steps of the present invention.

FIG. 1 illustrates an initial structure which may be employed in the inventive method. Specifically, the initial structure shown in FIG. 1 includes semiconducting substrate 10 having opening 12 present therein. Opening 12 includes sidewalls 14 which extend to common bottom wall 16. It is noted that although this drawing shows the presence of a single opening in the substrate, the inventive method works well when a plurality of openings are present in the substrate. The structure shown in FIG. 1 also includes an optional planar hard mask which is labeled as 18 in FIG. 1. Note that the wavy lines are used to separate the lower portion of the opening including bottom wall 16 from an upper portion of the opening.

The initial structure shown in FIG. 1 is composed of conventional materials well known to those skilled in the art and conventional processing techniques that are also well known to those skilled in that art are employed in fabricating the same. For example, semiconducting substrate 10 may be comprised of Si, Ge, SiGe, GaAs, InAs, InP or all other III/V semiconductor compounds. Layered semiconducting substrates such as Si/SiGe, Si/Si and silicon-on-insulators (SOIs) are also contemplated herein. The substrate materials can be in either crystalline, polycrystalline, or amorphous form. The semiconductor substrate may be of the n- or p-type depending on the desired device to be fabricated. The semiconductor substrate may contain active device regions, wiring regions, isolation regions (e.g., trench isolation or LOCOS) or other like regions. For clarity, these other regions are not shown in the drawings, but are nevertheless meant to be included within region 10.

Optional planar hard mask 18 may then be formed atop the surface of substrate 10 utilizing a deposition process, such as chemical vapor deposition (CVD), plasma-assisted CVD, sputtering, and chemical solution deposition, well known to those skilled in the art. The optional planar hard mask may be composed of an oxide, nitride, glass material or any combination thereof including a stack such as nitride/oxide/BPSG (boron doped silicate glass).

A photoresist mask, not shown, is then formed atop the surface of the optional planar hard mask (or atop substrate 10, when no planar hard mask is employed) utilizing a conventional deposition process and thereafter the photoresist mask is patterned utilizing conventional lithography which includes exposing the photoresist to a pattern of radiation, and developing the pattern into the exposed photoresist utilizing a conventional resist developer. After the photoresist has been patterned, the pattern is transfer into the optional planar mask and substrate utilizing a conventional dry etching process such as reactive-ion etching, plasma-etching, ion beam etching, laser ablation or any combination thereof so as to form opening 12 in the substrate. It should be noted that the term "opening" is used herein to denote a trench, via or any other type of passageway that may be formed into a substrate. The depth of the opening, measured from the uppermost surface of substrate 10, is not critical to the present invention. Typically, however, the opening has a depth, measured from the top surface of substrate 10, of from about 0.1 to about 10 µm, with a depth of from about 5 to about 10 µm being more highly preferred.

Following the formation of the opening, the photoresist is removed utilizing a conventional stripping process well known to those skilled in the art so as to provide the structure shown in FIG. 1. At this point of the inventive process the optional planar hard mask is removed utilizing a conventional planarization process such as chemical-mechanical polishing (CMP).

Figure 2:
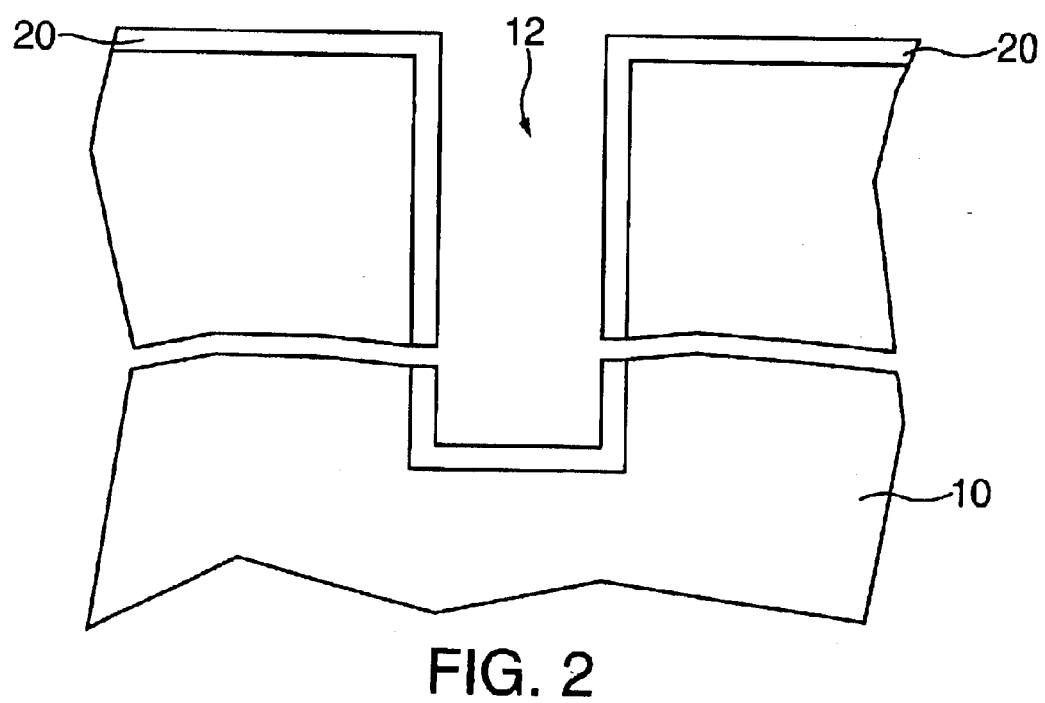

Next, and as shown in FIG. 2, oxide layer 20 is formed on all exposed surfaces of substrate 10, including the vertical sidewalls and horizontal bottom wall of the opening. The oxide layer is formed utilizing a conventional deposition process such as CVD, or alternatively, oxide layer 20 is formed by a conventional thermal oxidation process. The oxide layer formed at this point of the present invention is a uniform, thin oxide layer having a thickness of from about 50 to about 100 Å.

Figure 3:
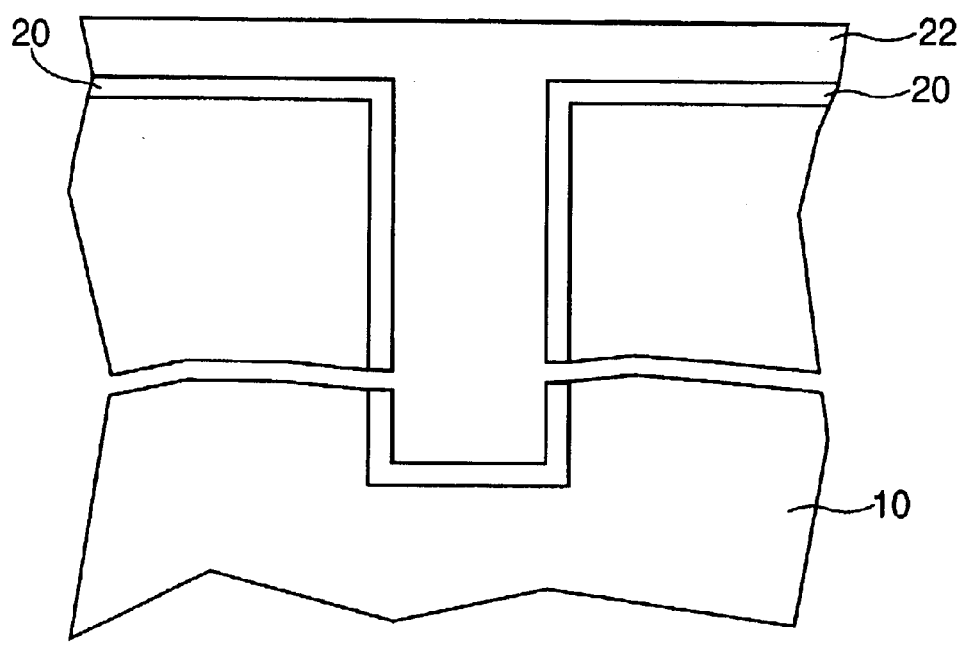

Resist fill material 22 is then formed atop oxide layer 20 and within the opening so as to provide the structure shown, for example, in FIG. 3. Specifically, resist fill material 22 is a conventional polymeric resist material which is capable of filling an opening. In accordance with the present invention, the resist fill material is formed utilizing a conventional deposition process such as CVD.

Figure 4:
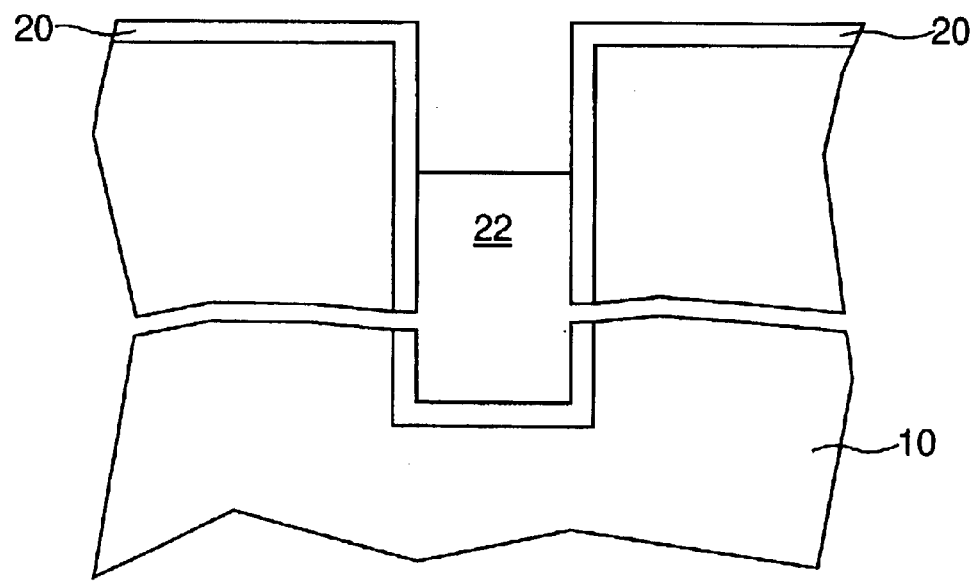

After applying the resist fill material to the structure, the resist fill material shown in FIG. 3 is recessed to a predetermined level (typically about 1 μm or less) beneath the surface of substrate 10 so as to provide the recessed structure shown, for example, in FIG. 4. Recessing is carried out in the present invention by utilizing a timed etching process which is highly selective for removing portions of the resist fill material from the opening, but not oxide layer 20 that is present beneath the resist fill material. Note that portions of oxide layer in the upper portion of the opening are exposed after this recessing step.

Following recessing, the exposed portion of oxide layer 20 is removed from the structure utilizing a conventional wet chemical etching process, and thereafter the recessed resist fill material is removed from inside the lower portion of the opening utilizing the above-mentioned etching process that was employed in recessing. These steps of the present invention, i.e., wet etching and removal of the previously recessed resist fill material from the opening, provide the structure shown in FIG. 5. Note that in this drawing, the upper sidewalls of the opening are exposed, whereas at least the lower portion of the opening still contains oxide layer 20 thereon.

In some embodiments of the present invention, a $H_2$ prebake step may be employed at this step of the present invention to remove any native oxide layer that may be present on the exposed upper portions of the openings. Specifically, $H_2$ prebaking is performed at a temperature of from about 700° C. to about 1000° C. and at a pressure of from about 1 to about 300 Torr.

Figure 5:
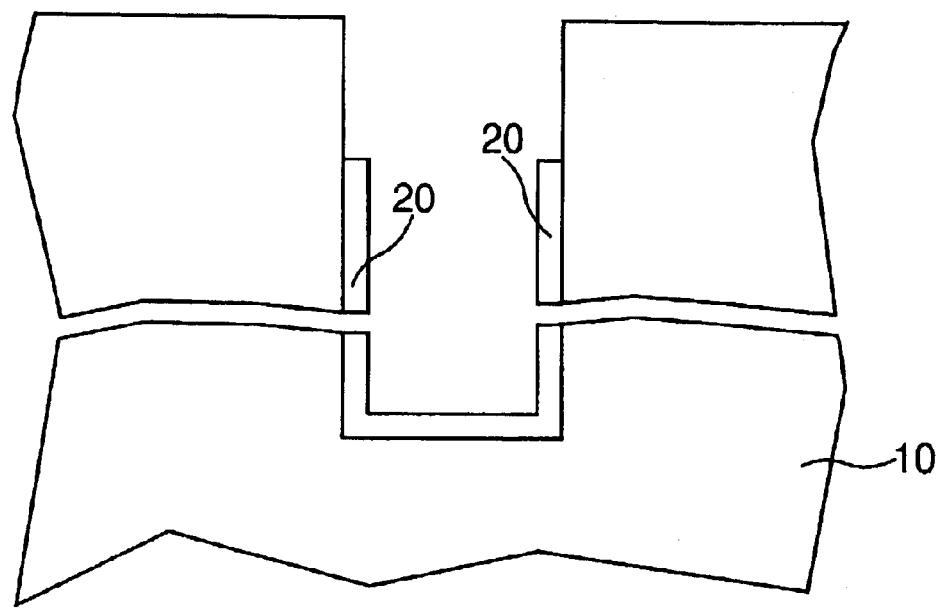
Figure 6:
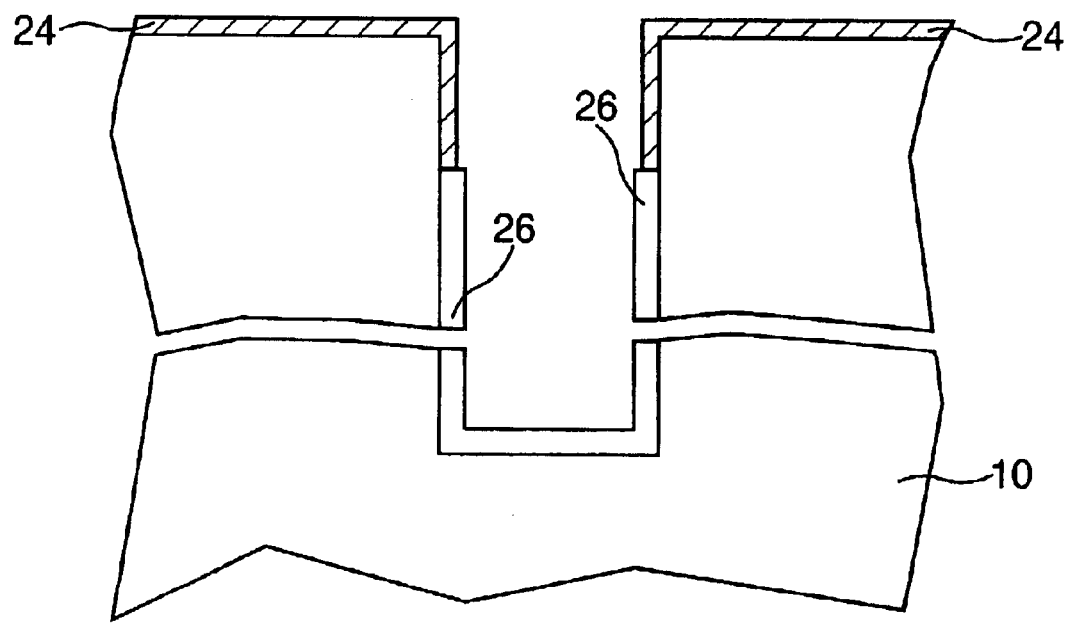

Next, and as shown in FIG. 6, thermal nitride vertical hard mask 24 is formed on at least the upper portion of the sidewalls that are exposed in FIG. 5. The thermal nitride hard mask is a uniform layer whose thickness is from about 10 to about 50 Å. The thermal nitride layer is formed by heating the structure shown in FIG. 5 at high temperatures, on the order of from about 600° C. to about 1200° C., in the presence of a nitrogen-containing source gas. Illustrative examples of nitrogen-containing source gases include, but are not limited to: $N_2$, $N_2O$, $NH_3$ and mixtures thereof. The nitrogen-containing source gas can also include various nitrogen-containing radicals such as atomic nitrogen, $NH_2$, and NH radicals. The radicals can be created with the aid of some excitation, for instance, a plasma excitation, a photo excitation, an electron-beam excitation, or intense heat. The radicals can be primarily formed either in the vicinity of the wafer or far from the processing zone. In the latter case, an efficient delivery system should be present to transfer radicals to the processing zone with minimal losses. If the nitrogen-containing gas consists of an appreciable amount of atomic nitrogen or other nitrogen-containing radicals the thermal nitride can be formed at a substantially lower temperature. The preferred temperature range in this case is from about room temperature to about 1200° C. It is noted that during the formation of the thermal nitride layer, oxide layer 20 remaining in the lower portion of the opening is converted into a nitrided oxide layer. The nitrided oxide layer is labeled as 26 in FIG. 6.

It is important to note that in some prior art processes a sacrificial nitride layer formed via deposition may be applied to the exposed sidewalls of the opening. The use of thermal nitride instead of deposited nitride is important in the present invention since thermal nitrides are formed preferentially only on the exposed portion of the opening and have a smaller etch rate as compared to deposited nitride. The smaller etch rate allows for selective removal of material from the bottom portion of the opening without completely removing the material from the upper portion of the opening which typically occurs when deposited nitride layers are employed as a vertical hard mask.

The thermal nitride vertical mask 24 can be optionally thickened with the well-known selective deposition process. The process allows for the deposition of nitride on nitride surface while leaving oxide surface substantially intact. The selective deposition is a timed process such that the deposition time is shorter that the nucleation time on the oxide surface. Using such a deposition process one can deposit approximately 5 to 15 angstroms of SiN on the thermal nitride while only nitriding the oxide surface. The oxide surface can be cleaned with a slow nitride wet etch such that there is still additional 5–10 Å of nitride remaining on the thermal nitride mask. This process can be optionally repeated to thicken the mask even further.

Nitrided oxide layer 26 is then selectively removed from at least the lower portion of the opening so as to expose the underlying substrate material in the opening; See FIG. 7. Specifically, nitrided oxide layer 26 is removed from the structure utilizing a wet etching process that is highly selective in removing the nitrided oxide layer as compared to nitride and substrate. It is noted that during this selective wet etch process the thermal nitride layer present in the upper portion of the opening may be slightly thinned.

With the thermal nitride vertical hard mask in place, the structure is then subjected to a doping process which is capable of forming buried plate 28 about the exposed lower portion of the opening. The resultant structure formed after this step of the present invention is performed is shown, for example, in FIG. 8. The doping is carried out utilizing a conventional gas phase dopant technique which is well known to those skilled in the art.

Figure 7:
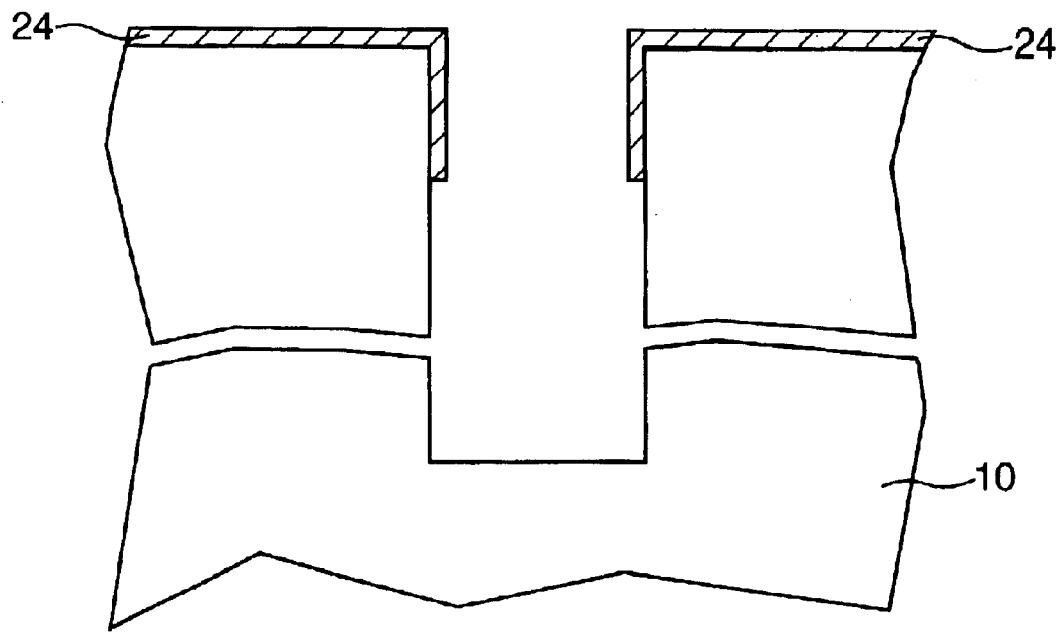
Figure 9:
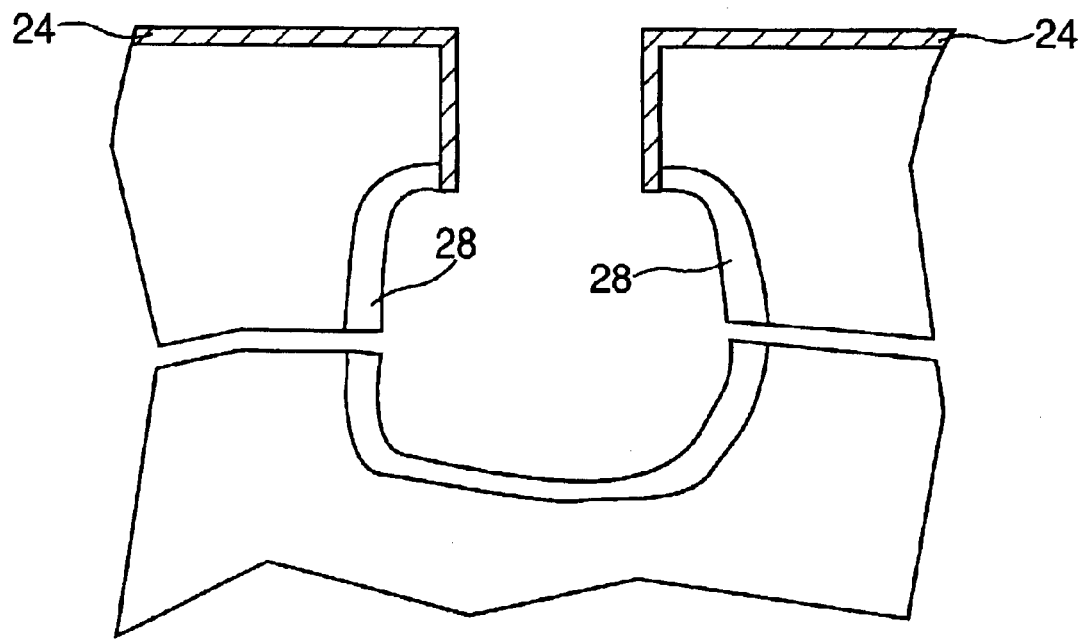

FIG. 9 shows an optional structure that is formed after an optional bottle etching process and gas phase doping is performed on the structure shown in FIG. 7. The bottle etching process includes the use of a well known self-limiting or timed wet etching process wherein a chemical etchant that is selective in removing substrate material as compared to thermal nitride is employed. It is noted that the bottle etching process results in a structure wherein the lower portion of the opening abutting the bottom wall is elongated as compared to the upper portion of the opening.

Figure 8:
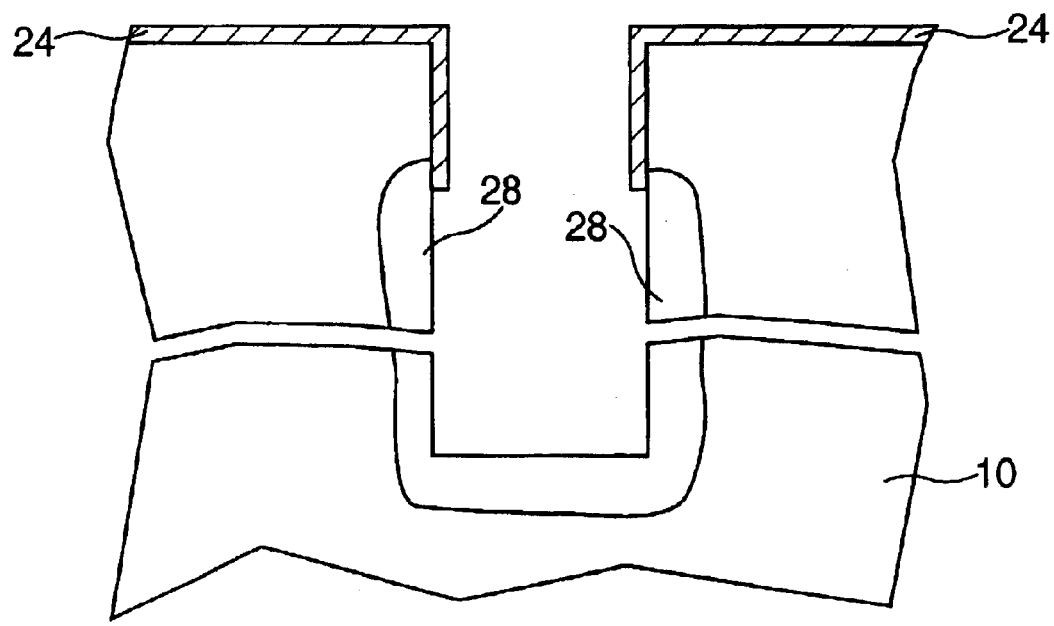
Figure 10:
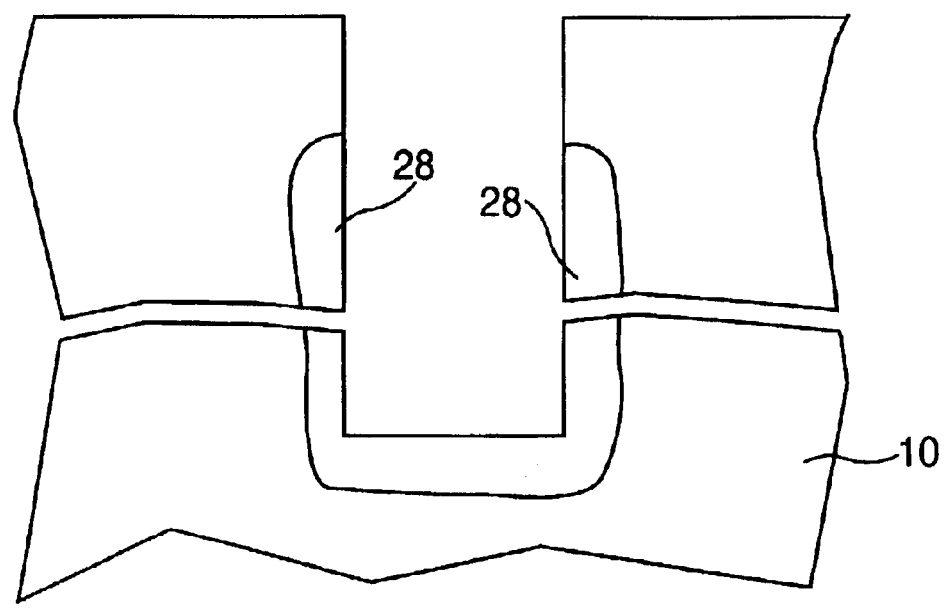

FIG. 10 shows a structure that is formed after the thermal nitride is optionally stripped from the upper portion of the opening shown in FIG. 8 utilizing an etching process which is highly selective in removing thermal nitride as compared to substrate.

Figure 11:
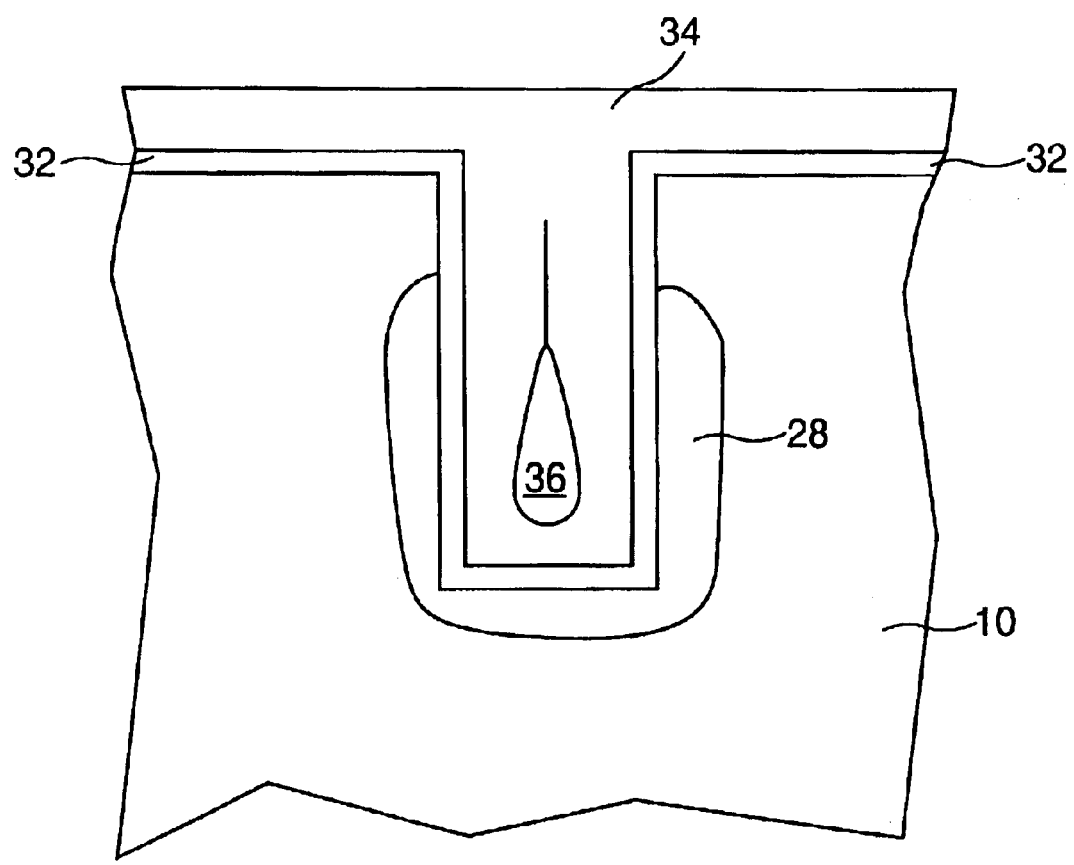

Next, node dielectric 30 and conductive material 32 are formed on any of the structures show in FIGS. 8, 9 and 10. FIG. 11 shows the node dielectric and conductive material formed in the structure of FIG. 10. Node dielectric 30 which is comprised of a conventional dielectric material such as $SiO_2$ is formed utilizing a conventional deposition process such as CVD. Conductive material 32, which is comprised of polysilicon, a conductive metal or any combination thereof is formed utilizing a conventional deposition process such as CVD, plating, or sputtering. Note that the deposition of conductive materials may cause the formation of void 36 in opening 12.

Further processing may follow the above described processing steps including, for example, recessing of conductive material 34, buried strap formation, collar formation and formation of a transistor above the capacitor region described above.

It is noted that in the preferred embodiment shown above, the thermal nitride vertical hard mask allows for conductive material 34 to be filled into narrow openings, and very simple processing steps compared to a conventional sacrificial oxide collar scheme are employed.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention is not limited to the exact forms and details described and illustrated, but fall within the scope of the appended claims.

What is claimed is:

1. A method for fabricating a 3D microelectronic structure having a thin, uniform thermal nitride formed on at least an upper portion of each expose sidewalls of at least one opening, said method comprising the steps of:

forming at least one opening in a surface of a substrate, said at least one opening having sidewalls which extend to a common bottom wall;

forming an oxide layer on a bottom portion of each sidewall including the common bottom wall of said at least one opening;

forming a thermal nitride layer having a thickness from about 10 to about 50 Å on at least an upper portion of each sidewall of said at least one opening, wherein during said forming the thermal nitride layer said oxide layer is converted into a nitrided oxide layer; and selectively removing said nitrided oxide layer from said bottom portion of each sidewall including the common bottom wall of said at least one opening thereby exposing a surface of said substrate for subsequent formation of a trench capacitor in said at least one opening.

2. The method of claim 1 wherein said at least one opening is formed by lithography and etching.

3. The method of claim 1 wherein said thermal nitride layer is formed by heating said substrate at a temperature of from about 600° to about 1200° C. in the presence of a nitrogen-containing source gas.

4. The method of claim 1 further comprising elongating a lower portion of said opening using said thermal nitride layer as a vertical hard mask after said selectively removing said nitrided oxide layer.

5. The method of claim 4 further comprising forming a buried plate about said elongated lower portion of said at least one opening.

6. The method of claim 5 wherein said buried plate is formed by a gas phase doping process.

7. The method of claim 1 further comprising forming a buried plate about a lower portion of said at least one opening using a gas phase doping process and said thermal nitride layer serves as a dopant diffusion barrier.

8. The method of claim 1 wherein a $H_2$ prebake process is performed prior to forming said thermal nitride layer so as to remove native oxide from said upper portion of said at least one opening.

9. The method of claim 8 wherein said $H_2$ prebake process is carried out at a temperature of from about 700° to about 1000° C. and at a pressure of from about 1 to about 300 Torr.

10. The method of claim 1 wherein said thermal nitride layer is formed in the presence of a nitrogen-containing radical and at a temperature from about room temperature to about 1200° C.

* * * * *